(12) United States Patent
Morikawa

(10) Patent No.: US 7,016,222 B2
(45) Date of Patent: Mar. 21, 2006

(54) NONVOLATILE SEMICONDUCTOR MEMORY DEVICE

(75) Inventor: Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/729,310

(22) Filed: Dec. 5, 2003

(65) Prior Publication Data
US 2004/0130939 A1    Jul. 8, 2004

(30) Foreign Application Priority Data
Dec. 5, 2002    (JP) .............................. 2002-353734

(51) Int. Cl.
*G11C 11/00* (2006.01)
(52) U.S. Cl. ..................................... 365/158; 365/148
(58) Field of Classification Search ................. 365/158, 365/148, 100, 104
See application file for complete search history.

(56) References Cited

U.S. PATENT DOCUMENTS

| 6,204,139 | B1   | 3/2001  | Liu et al. |
| 6,740,921 | B1 * | 5/2004  | Matsuoka et al. .......... 257/302 |
| 6,760,244 | B1 * | 7/2004  | Yamada ........................ 365/63 |
| 6,791,869 | B1 * | 9/2004  | Ooishi ......................... 365/158 |
| 6,822,895 | B1 * | 11/2004 | Yamada ....................... 365/158 |
| 6,862,235 | B1 * | 3/2005  | Sakata et al. ............... 365/202 |
| 6,868,004 | B1 * | 3/2005  | Hidaka et al. .............. 365/171 |

FOREIGN PATENT DOCUMENTS

JP    2002-151661    5/2002

\* cited by examiner

*Primary Examiner*—Thong Q. Le
(74) *Attorney, Agent, or Firm*—Morrison & Foerster LLP

(57) ABSTRACT

A memory cell array is included which is constituted by arranging the plurality of nonvolatile memory cells in a row direction and column direction respectively and arranging the plurality of word lines (WL) and the plurality of bit lines (BL) in the row direction and the column direction respectively in order to select a predetermined memory cell or a memory cell group out of the arranged nonvolatile memory cells, in which the memory cells are respectively constituted by connecting one end of a variable resistive element for storing information in accordance with a change of electrical resistances with the source of a selection transistor while in the memory cell array, the drain of the selection transistor is connected with a common bit line (BL) along the column direction, the other end of the variable resistive element is connected with a source line (SL), and the gate of the selection transistor is connected with the common word line (WL) along the row direction. According to the above memory cell configuration, it is possible to provide a nonvolatile semiconductor memory device capable of reducing voltage stresses applied to the variable resistive element of an unselected memory cell at the time of the reading and programming operations and securing a higher-reliability data holding characteristic.

5 Claims, 11 Drawing Sheets

NONVOLATILE SEMICONDUCTOR MEMORY DEVICE

BACKGROUND OF THE INVENTION

1. Field of the Invention

The present invention relates to a nonvolatile semiconductor memory device having a memory cell array constituted by arranging a plurality of nonvolatile memory cells in a row direction and column direction respectively and arranging the plurality of word lines and the plurality of bit lines in the row direction and the column direction respectively in order to select a predetermined memory cell or memory cell group out of the arranged nonvolatile memory cells, more particularly relates to a nonvolatile semiconductor memory device having a variable resistive element in which a memory cell stores information in accordance with a change of electrical resistance.

2. Description of the Related Art

A technique is proposed in which one or more short electrical pulses is or are applied to a thin material having a perovskite structure, particularly a thin film or bulk constituted by a colossal magnetoresistance material (CMR) or a high temperature superconductivity (HTS) material to change electrical characteristics of the thin film or bulk. It is allowed that the electric field intensity and current density by the electrical pulses are large enough to change physical states of the material but the intensity and density respectively have a low enough energy unable to break the material and the electrical pulses have positive or negative polarity. Moreover, by repeatedly applying electrical pulses several times, it is possible to further change material characteristics.

The above prior art is disclosed in the specification of U.S. Pat. No. 6,204,139. FIGS. 8 and 9 are graphs respectively showing a relation between applied pulse number and resistance value in the prior art. More minutely, FIGS. 8 and 9 respectively show a relation between pulse number to be applied to a CMR thin film grown on a metallic substrate and resistance. In FIG. 8, a voltage pulse at an amplitude of 32 V and a pulse width of 71 ns is applied 47 times. Under the conditions, it is found from FIG. 8 that a resistance value changes by approx. one order of magnitude.

FIGS. 10 and 11 are graphs respectively showing a relation between polarity of applied pulse and resistance value in a prior art. FIG. 10 shows a resistance change state when applying voltage pulses of +12 V (positive polarity) and −12 V (negative polarity). In FIG. 11, applied voltages are +51 v and −51V and a resistance is measured after applying the pulse of each polarity. As shown in FIGS. 10 and 11, it is possible to decrease a resistance value by applying a positive-polarity pulse several times and thereafter increase the resistance value by applying a negative-polarity pulse (finally, resulting in a saturated state). It is considered that the above mentioned is applied to a memory device by bringing a state of applying a positive-polarity pulse into a reset state and a state of applying a negative-polarity pulse into a programming state.

The above conventional example discloses a case of arranging CMR thin films having the characteristic concerned like an array to constitute a memory array. In the case of the memory array concerned shown in FIG. 12, a bottom face electrode 26 is formed on a substrate 25 and a variable resistive element 27 and an upper face electrode 28 respectively constituting one bit are formed on the bottom face electrode 26. A wire 29 is connected to the upper face electrode 28 every bit to apply a programming pulse. Moreover, in the case of reading, a current corresponding to the resistance value of the variable resistive element 27 is read from the wire 29 connected to the upper face electrode 28 every bit.

However, because resistance changes of CMR thin films shown in FIGS. 10 and 11 are approx. two times, it is preferable that the resistance changes are larger in order to smoothly identify a reset state and a programming state when considering the fluctuation between elements. Moreover, the resistance changes are not suitable for a memory device in which a voltage to be applied to a CMR thin film is high and for which low voltage operations and low power consumption are requested.

Therefore, the applicant of this application was able to obtain a new characteristic by using PCMO ($Pr_{0.7}Ca_{0.3}MnO_3$) which is a CMR material of an oxide having the perovskite structure same as the case of the prior art and containing manganese and thereby, applying one or more short electrical pulses. Specifically, by applying low voltage pulses of approx. ±5 V, a characteristic is obtained in which the resistance value of a thin film material is changed from hundreds of Ω up to approx 1 MΩ. Hereafter, the variable resistive element formed by the perovskite-structural oxide containing manganese is referred to as RRAM (Resistance control nonvolatile Random Access Memory) device.

Moreover, in addition to the above CMR thin film, there is a device which realizes a nonvolatile memory by using a magnetic field or heat instead of an electrical pulse, thereby changing electrical resistances to store information, and reading the information corresponding to the changed resistance value. For example, the following devices are proposed: MRAM (Magnetic RAM), OUM (Ovonic Unified Memory), and MTJ (Magnetic Tunnel Junction). A memory array device configuration using the above MTJ device is disclosed in Japanese Unexamined Patent Publication No. 2002-151661. FIG. 5 shows a memory cell configuration of this prior art only for a signal relating to reading.

However, in the case of the memory array shown in FIG. 12, a wire is connected to an electrode every bit and a programming pulse is applied through wire at the time of the programming operation. Moreover, at the time of reading, it is possible to evaluate the characteristic of a thin film material in order to read a current from a wire connected to an electrode every bit. However, there is a problem that it is impossible to raise the integration degree of a memory device. Furthermore, everything is controlled in accordance with a signal from the outside of a memory device in order to perform the programming operation, reading operation, and resetting operation. Hence, the memory device is not constituted as a conventional memory device capable of controlling the programming operation, reading operation, and resetting operation.

FIG. 13 is a circuit diagram schematically showing a configuration of a memory array closer to an actual device. A memory array 10 is constituted in which variable resistive elements Rc formed by using the above PCMO material are arranged like a matrix of 4×4. One-hand terminals of variable resistive elements Rc are connected to word lines W1 to W4 and the other-hand terminals of it are connected to bit lines B1 to B4. A peripheral circuit 32 is set adjacently to the memory array 10. A bit line selection transistor 34 is connected to each of the bit lines B1 to B4 to form a route to an inverter 38. A load transistor 36 is connected between the bit selection transistor 34 and the inverter 38. According to the above configuration, it is possible to program or read data in or from each variable resistive element Rc of the memory array 10.

In the case of the conventional memory array 10, memory operations can be performed at a low voltage. However, in the case of the programming and reading method, it is impossible to evaluate a correct current value at the time of the reading operation because a leak current to a memory cell adjacent to a memory cell to be accessed is generated. Moreover, because a leak current to an adjacent memory cell is also generated at the time of the programming operation, it may be impossible to perform a correct programming operation.

For example, in the case of the reading operation, it is possible to form a current route shown by an arrow A1 by connecting a power supply voltage Vcc to the word line W3, the bit line B2 to a ground potential GND, opening other bit lines B1, B3, and B4 and word lines W1, W2, and W4, and turning on a bit selection transistor 34a. Therefore, it is possible to read the resistance value of a variable resistive element Rca. However, current routes shown by arrows A2 and A3 are generated for the variable resistive element Rc adjacent to the variable resistive element Rca. Therefore, it is impossible to read the value of only the resistance of the variable resistive element Rca in a selected memory cell.

Therefore, it is possible to turn off the selection transistor of an unselected memory cell in an unselected row and thereby cut off a current route passing through an unselected variable resistive element formed in FIG. 13 and solve the above problems at the time of reading and programming by connecting a variable resistive element with a selection transistor in series and forming a memory cell as shown by the conventional example described in Japanese Unexamined Patent Publication No. 2002-151661.

A memory array when using an RRAM device as a variable restive element is described below. FIG. 6 is a circuit diagram of a memory cell 11 formed by connecting an RRAM device 2 and a selection transistor 3 in series, which has the same configuration as the memory cell in Japanese Unexamined Patent Publication No. 2002-151661 shown in FIG. 5. FIG. 7 shows a memory cell array configuration when using the memory cell 11. A plurality of RRAM devices is connected to bit lines BL1 to BL4 respectively.

First, the reading operation is described below. A bit selection transistor 4 is operated, for example, to apply 1.5 V to a bit line connected to a selected RRAM device so that a bias voltage can be applied to the bit line. At the same time, a word line connected to the gate of the selection transistor 3 (cell selection transistor) connected to the RRAM device 2 of a memory cell to be read is set to a high level (e.g. 7 V) by a word line driver 5 to turn on the cell selection transistor 3. Moreover, by setting the source of the cell selection transistor 3 (connected to common source lines SL1 and SL2) to a reference voltage (e.g. ground potential 0 V), a current route to the ground potential after passing through an RRAM device and the cell selection transistor 3 from the bias voltage of a bit line is generated. For an unselected memory cell, however, by setting the level of an unselected word line to a low level (e.g. ground voltage 0V) by the word line driver 5 and an unselected bit line to a low level or a high impedance (open state), a current route passing through a route other than the RRAM device of a memory cell selected by a reading bit line is disappeared. Under the above state, only a change of resistances of the selected RRAM device appears as a change of currents circulating through a bit line. By determining the current change by a reading circuit, it is possible to accurately read the information stored in a selected memory cell. As a result, it is possible to use a RRAM device as a memory device.

Then, the programming operation of the memory array is described below. In this case, it is assumed a case in which the resistance value of the RRAM device 2 is larger than a reference resistance value as a programming state and a case in which the resistance value is smaller than the reference resistance value as an erasing state. In this case, the bit line selection transistor 4 is operated so that a bias voltage can be applied to a bit line connected to the selected RRAM device 2, for example, to apply 3 V to the bit line. At the same time, a word line connected to the gate of the cell selection transistor 3 connected to the RRAM device 2 in which data is programmed is set to a high level (e.g. 7 V) by the word line driver 5 to turn on the cell selection transistor 3. Moreover, by setting the source (connected to common source lines SL1 and SL3) of the cell selection transistor 3 a predetermined value (e.g. ground potential 0 V), a current rouge is generated from the bias voltage of a bit line to the ground potential after passing through the RRAM device and cell selection transistor and data is programmed in a selected memory cell. For an unselected memory cell, however, by setting an unselected word line to a low level (e.g. ground potential 0 V), a current route from a selected bit line to the ground potential is not formed or data is not programmed.

Then, the erasing operation of the memory array is described for a case of block erasing which erases data in a lump every block. The bit selection transistors 4 are operated so that a bias voltage can be applied to all bit lines connected to RRAM devices in a block to apply the ground potential 0 V to the bit lines. At the same time, word lines connected to the gates of the cell selection transistors 3 connected to all RRAM devices are set to a high level (e.g. 7 V) to turn on the cell selection transistors. Moreover, by setting the sources (connected to common source lines SL1 and SL2) of the cell selection transistors 3 to a reference voltage such as 3 V, current routes are generated from the bias voltage of a common source lines to the bit lines having a ground potential 0 V through all cell selection transistors and RRAM devices in the block. According to the above operations, erasing operations of all memory cells in the block can be performed.

However, in the case of the above configuration in FIG. 7, not only a selected RRAM device but also an unselected RRAM device is connected to a selected bit line. Therefore, when applying a bias voltage to a bit line which is read for the reading operation, a voltage stress may be applied to the unselected RRAM device though a word line in an unselected row is kept at a low level. Moreover, even if the voltage stress is so weak that it can be ignored for one-time reading operation, the voltage stress may be repeatedly generated in the same memory cell. Therefore, resistance states of the RRAM device may be slowly changed for a long time. Furthermore, the same problem as the case of the reading operation may occur in the programming operation. Hence, it is requested to establish a higher-reliability data retention characteristic. It is requested to more securely avoid this problem because the RRAM device is a memory device for storing data by changing electrical resistances by an electrical stress and thereby, the RRAM device is more remarkable compared to the case of an MRAM device or OUM device for changing electrical resistances by a magnetic field or heat.

SUMMARY OF THE INVENTION

The present invention is made to solve the above problems and its object is to provide a nonvolatile semiconductor memory device capable of securing higher-reliability data retention characteristic by reducing a voltage stress to a variable resistive element of an unselected memory cell at the time of the reading and programming operations.

A first characteristic configuration of a nonvolatile semiconductor memory device of the present invention for achieving the above object lies in the fact that a semiconductor memory device is used which has a memory cell array constituted by arranging the plurality of nonvolatile memory cells in the row direction and the column direction respectively and arranging the plurality of word lines and the plurality of bit lines in the row direction and the column direction respectively in order to select a predetermined memory cell or a memory cell group out of the arranged nonvolatile memory cells. The memory cell is constituted by connecting one end of a variable resistive element for storing information in accordance with a change of electrical resistances with the source of a selection transistor while in the memory cell array, the drain of the selection transistor is connected with a common bit line along the column direction, the other end of the variable resistive element is connected with a source line, and the gate of the selection transistor is connected with a common word line along the row direction.

According to the above first characteristic configuration, because a memory cell is formed by connecting a variable resistive element with a selection transistor in series, the selection transistor is turned off for a memory cell in an unselected row. Therefore, it is possible to cut off a current route passing through variable resistive elements other than a selected memory cell and a problem does not occur that a selected memory cell cannot be correctly read at the time of the reading operation or programming operation for the data is erroneously programmed in an unselected memory cell. Moreover, because a configuration is used in which the selection transistor is set between the bit line and the variable resistive element, the variable resistive element of the unselected memory cell is electrically isolated from the bit line to which a predetermined reading and programming voltage is applied at the time of the reading and programming operations. Therefore, a problem of a voltage stress to the variable resistive element is solved which completely cannot be solved by the configuration of the conventional memory cell disclosed in Japanese Unexamined Patent Publication No. 2002-151661 and it is possible to have a higher-reliability data retention characteristic.

A second characteristic configuration of the nonvolatile semiconductor memory device of the present invention for achieving the above object lies in the fact that a semiconductor memory device is used which has a memory cell array constituted by arranging the plurality of nonvolatile memory cells in a row direction and a column direction respectively and arranging the plurality of word lines and the plurality of bit lines in the row direction and the column direction respectively in order to select a predetermined memory cell or a memory cell group out of the arranged nonvolatile memory cells. The memory cell is constituted by connecting one end of a variable resistive element for storing information in accordance with a change of electrical resistances with the source of a first selection transistor and moreover connecting the other end of the variable resistive element with the drain of a second selection transistor while in the memory cell array, the drain of the first selection transistor is connected with the common bit line along the column direction, the source of the second selection transistor is connected with a source line, and gates of the first and second selection transistors are connected with the common word line along the row direction.

According to the second characteristic configuration, because a memory cell connects a variable resistive element with two selection transistors in series, the selection transistors are turned off for an unselected memory cell. Therefore, it is possible to cut off a current route passing through variable resistive elements other than a selected memory cell. Thus, a problem does not occur that a selected memory cell cannot be correctly read at the time of the reading operation or programming operation for the data is erroneously programmed in an unselected memory cell. Moreover, because a configuration is used in which the selection transistor is set between the bit line and the variable resistive element, the variable resistive element of an unselected memory cell is isolated from the bit line to which a predetermined reading and programming voltage is applied at the time of the reading and programming operations. Therefore, the problem of a voltage stress to a variable resistive element is solved which completely cannot be solved by the configuration of the conventional memory cell disclosed in Japanese Unexamined Patent Publication No. 2002-151661. Moreover, because a configuration is used in which the selection transistor is set between the source line and the variable resistive element, the variable resistive element of an unselected memory cell is electrically isolated from the source line to which a predetermined erasing voltage is applied when selectively individually erasing some of memory cells in a memory cell array at the time of the individual erasing operation. Therefore, the variable resistive element is released from a voltage stress at the time of the individual erasing and it is possible to have a higher-reliability data holding characteristic.

In addition to the above first or second characteristic configuration, it is also a preferable characteristic configuration that the variable resistive element is a variable resistive element whose electrical resistances are changed due to an electrical stress. Moreover, it is a preferable characteristic configuration that the variable resistive element is formed by a perovskite structural oxide containing manganese.

According to these characteristic configurations, the functions and advantages of the above first or second characteristic configuration is brought out to a memory cell structure particularly sensitive to a voltage stress and improvement of its data retention characteristic is expected.

DETAILED DESCRIPTION OF THE INVENTION (PREFERRED EMBODIMENTS)

Embodiments of a nonvolatile semiconductor memory device of the present invention (hereafter properly referred to as "present invention device") are described below by referring to the accompanying drawings. A portion overlapped with that of a nonvolatile semiconductor memory device of the prior art is provided with the same symbol to describe it.

Figure 1:
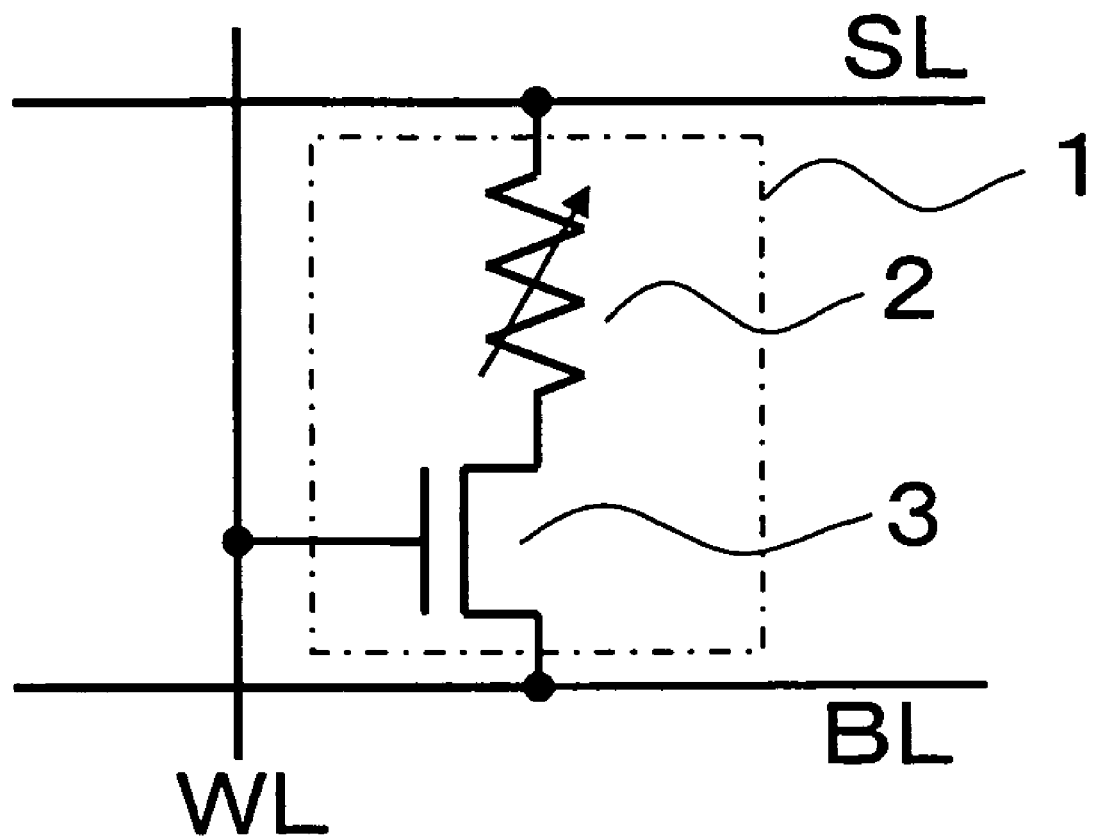
FIG. 1 is a circuit diagram showing a memory cell of an embodiment of a nonvolatile semiconductor memory device of the present invention.
Figure 5:
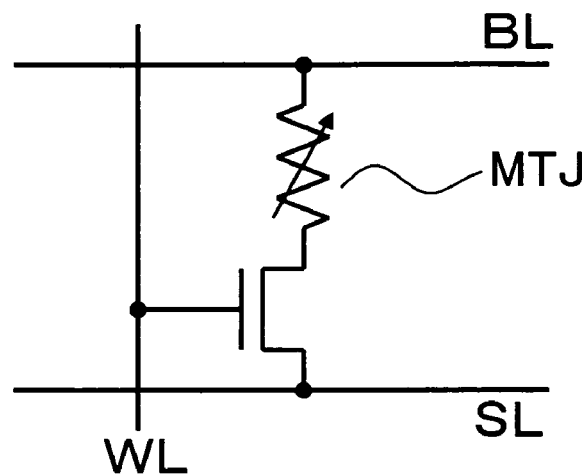
FIG. 5 is a circuit diagram showing a memory cell configuration of a conventional nonvolatile semiconductor memory device.
Figure 6:
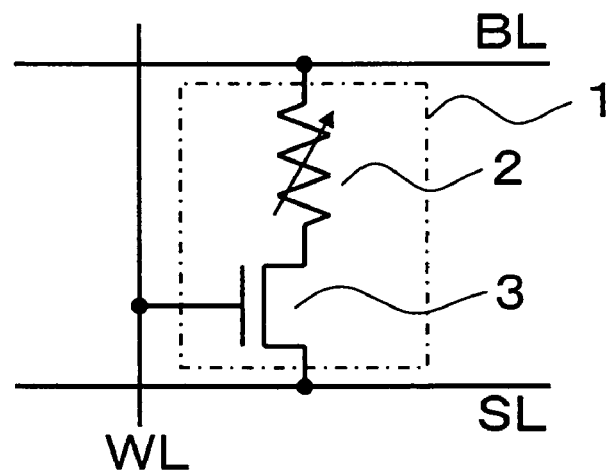
FIG. 6 is a circuit diagram showing another memory cell configuration of the conventional nonvolatile semiconductor memory device.
Figure 7:
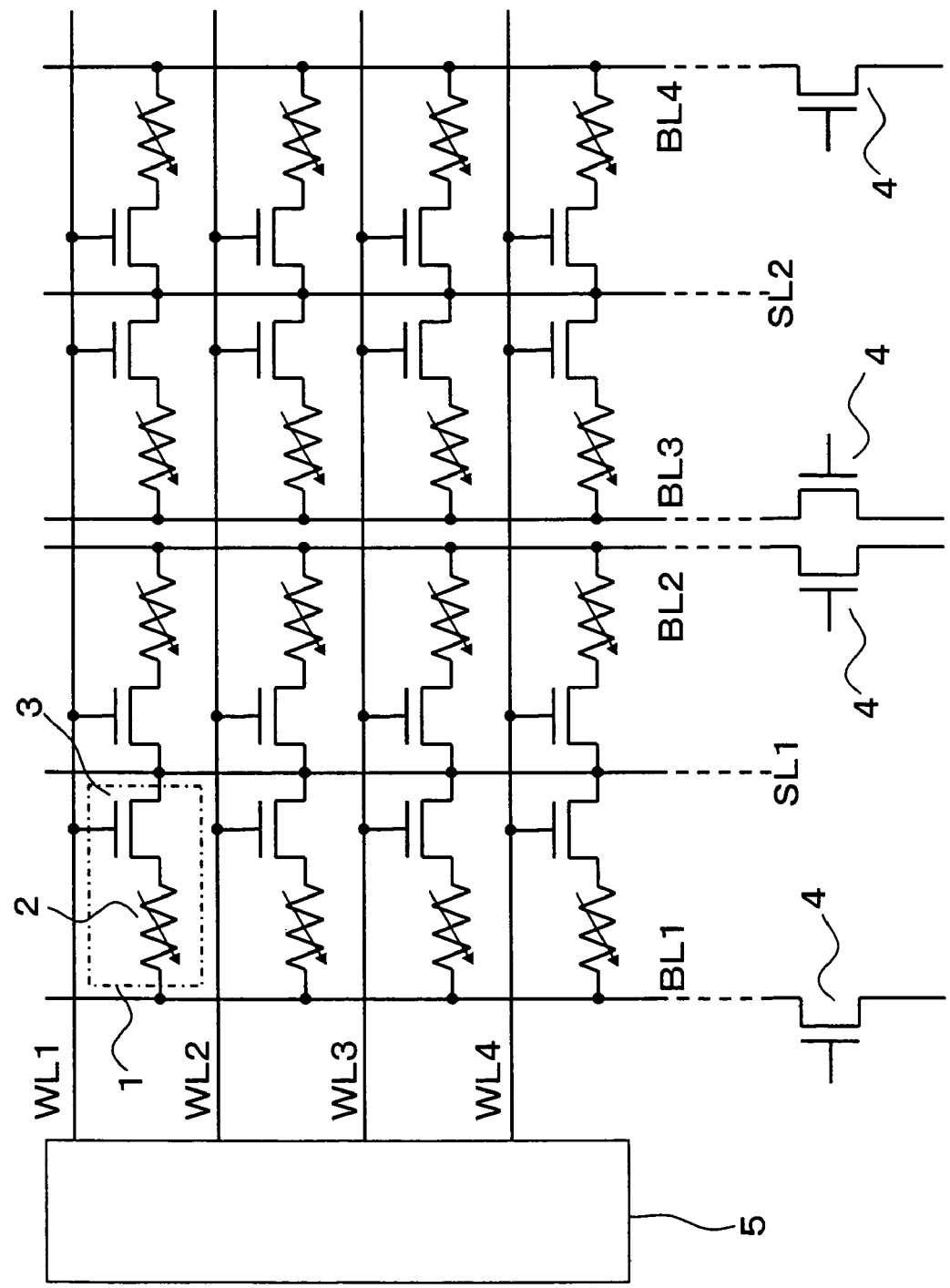
FIG. 7 is a circuit diagram showing a memory cell array configuration of a conventional nonvolatile semiconductor memory device using the memory cell shown in FIG. 6.
Figure 8:
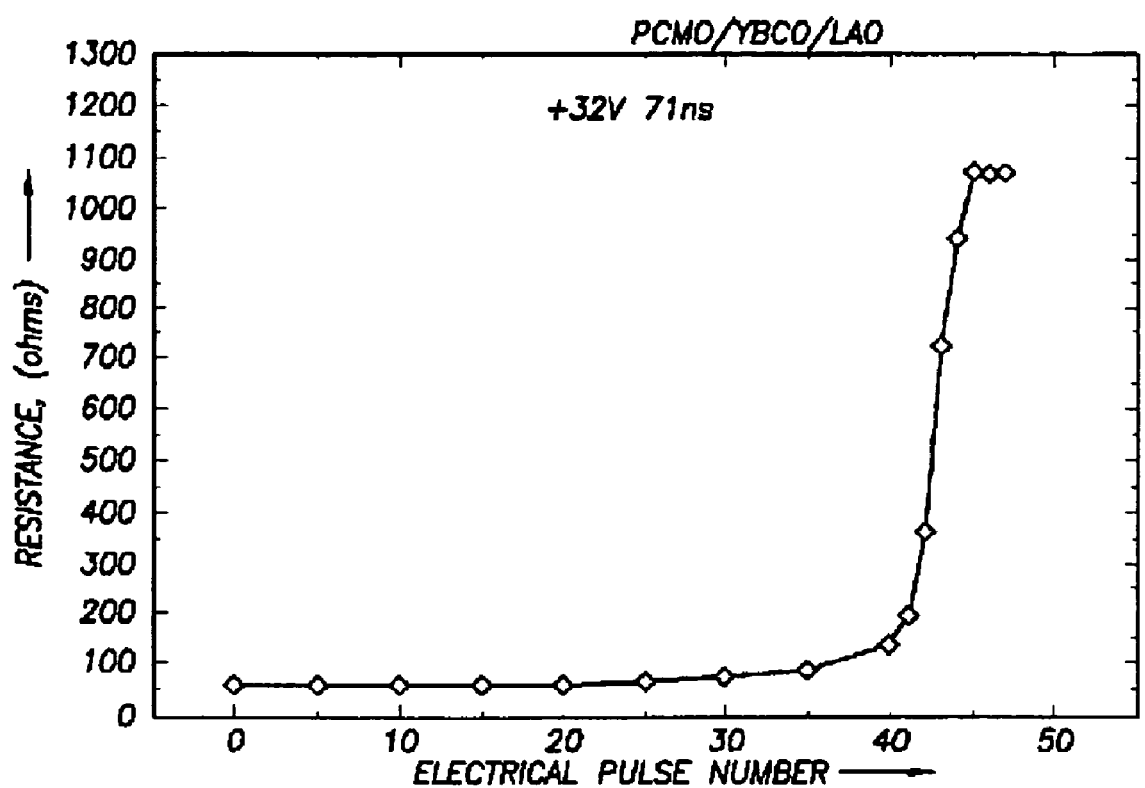
FIG. 8 is a graph showing a relation between applied pulse number and resistance value of the prior art.
Figure 9:
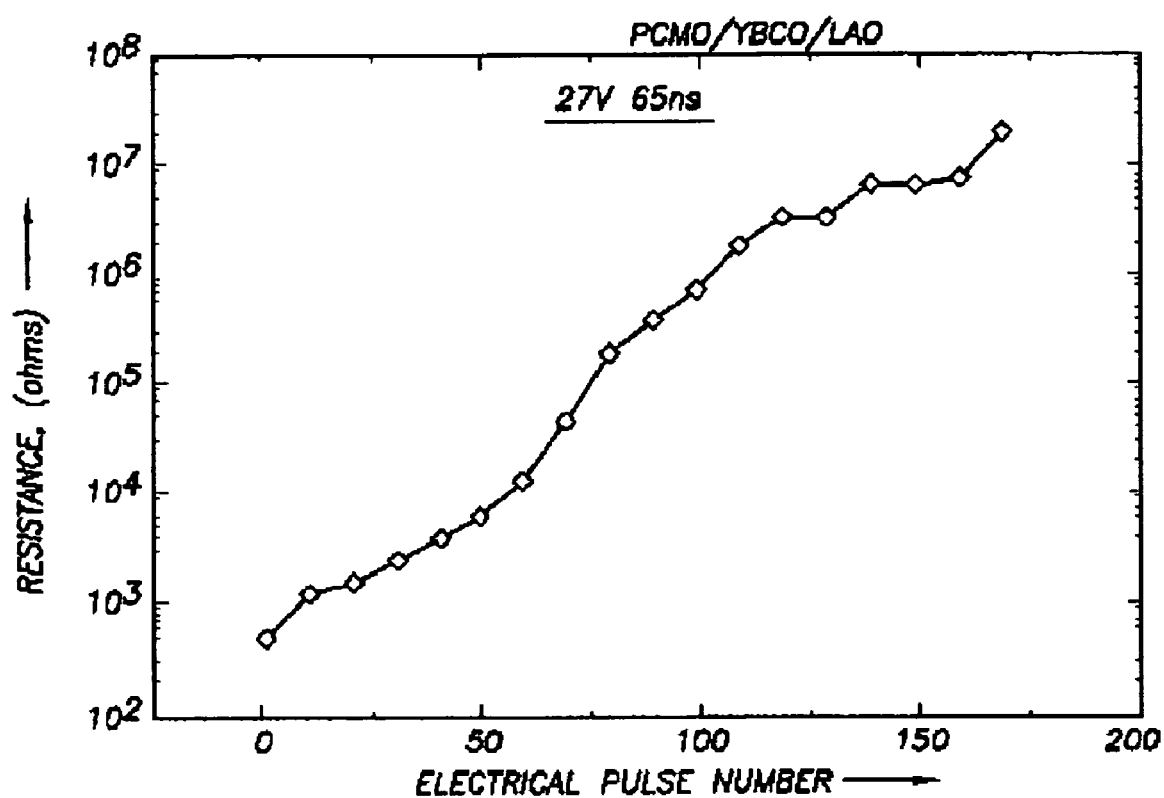
FIG. 9 is a graph showing a relation between applied pulse number and resistance value of the prior art.
Figure 10:
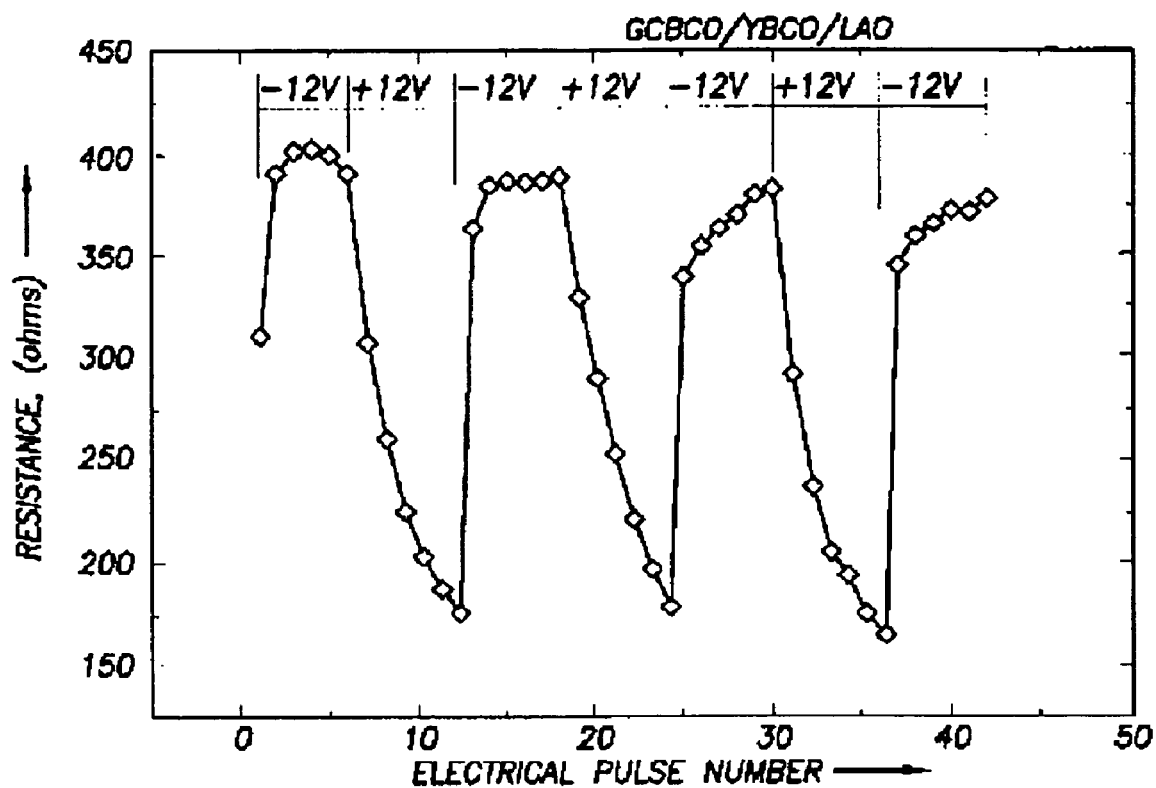
FIG. 10 is a graph showing a relation between polarity of applied pulse and change of resistance values of the prior art.
Figure 11:
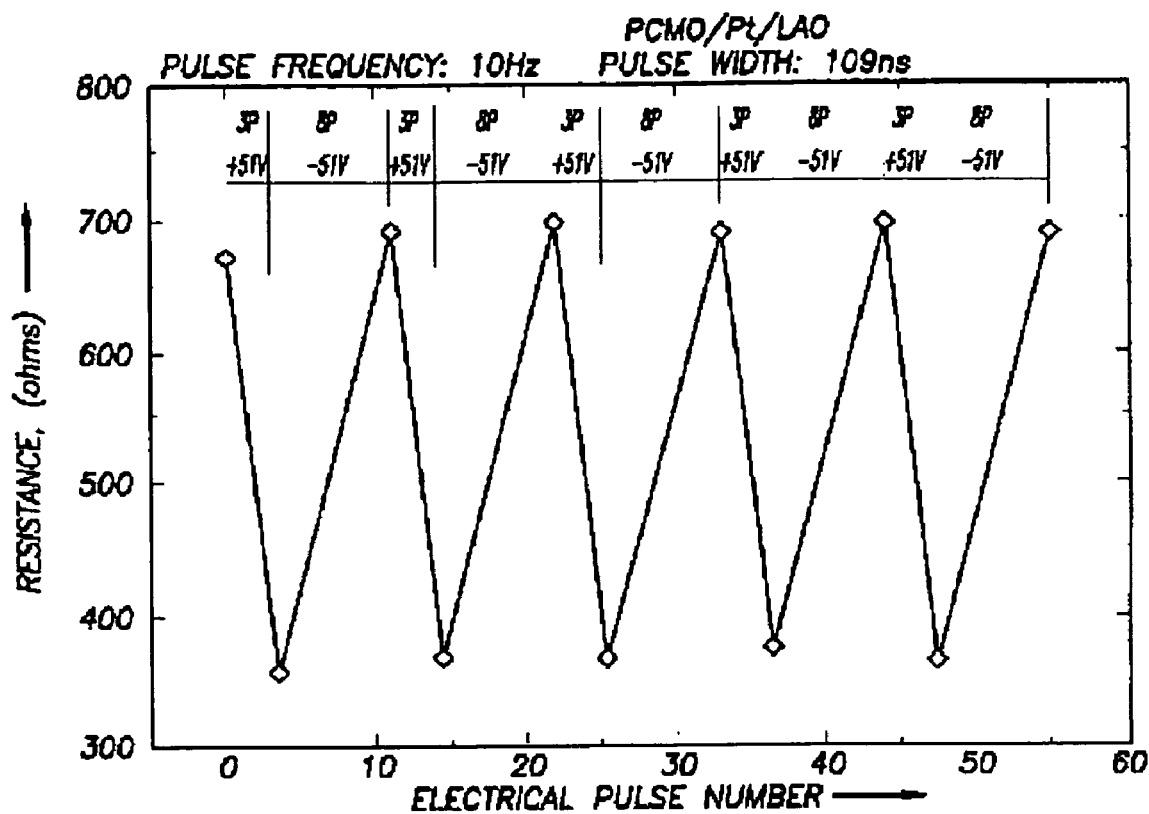
FIG. 11 is a graph showing a relation between polarity of applied pulse and change of resistance values of the prior art.
Figure 12:
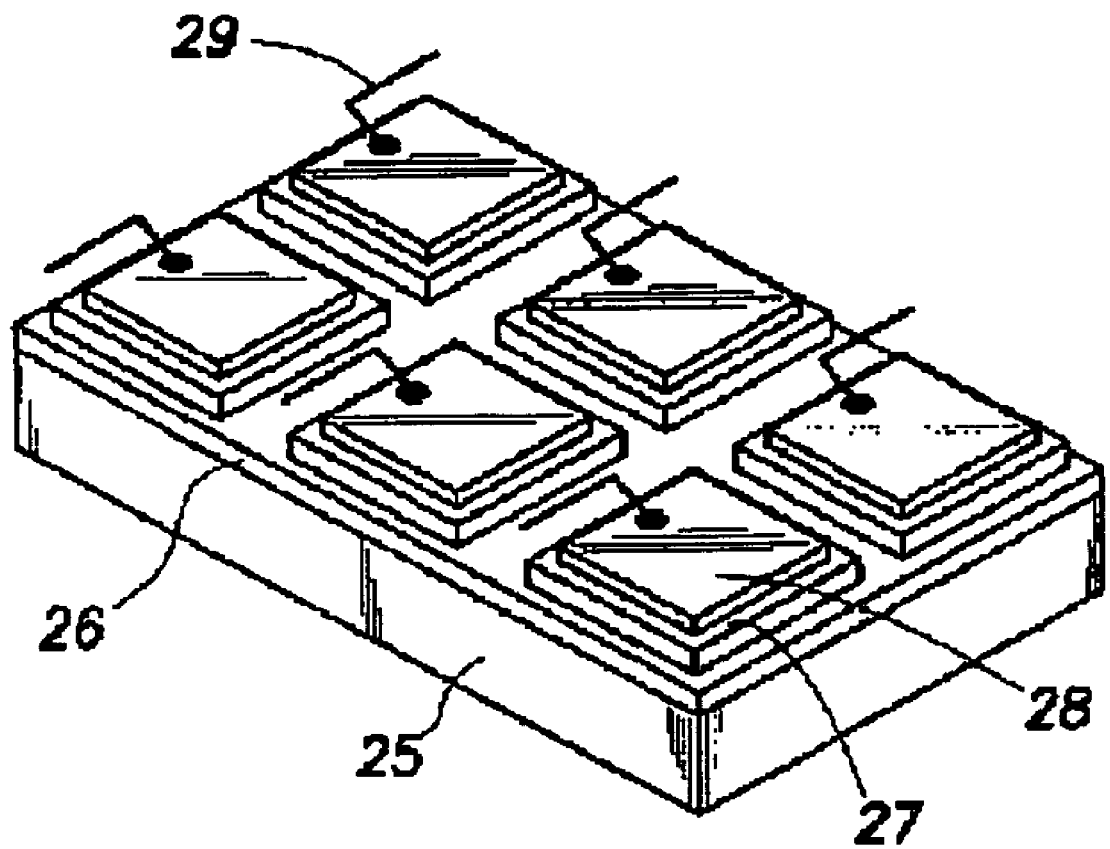
FIG. 12 a perspective view showing a memory array configuration of the prior art.
Figure 13:
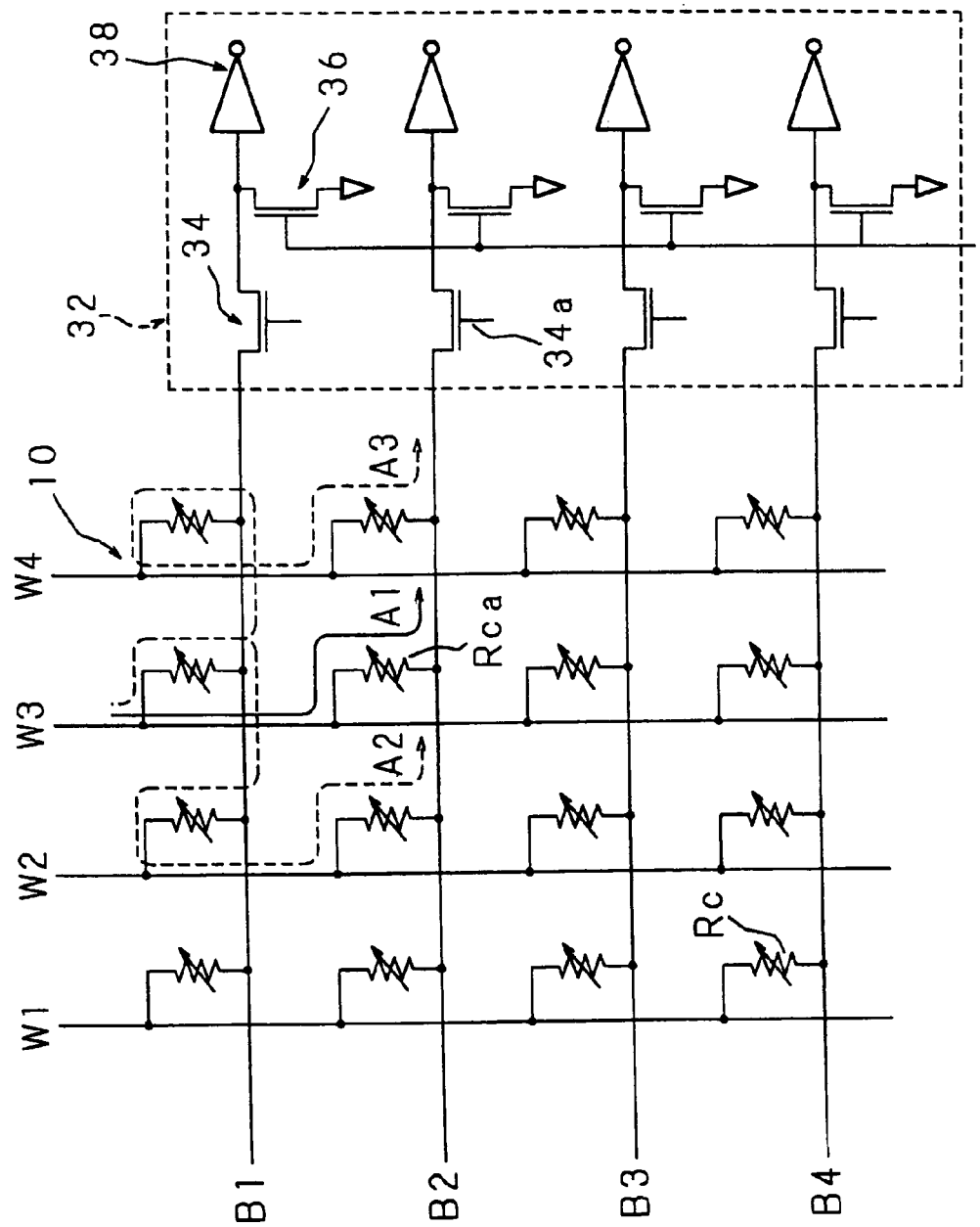
FIG. 13 is a circuit diagram showing a memory array configuration of a conventional nonvolatile semiconductor memory device.

FIG. 1 shows a memory cell configuration of the present invention device. As shown in FIG. 1, a memory cell 1 is constituted by connecting one end of the RRAM device 2 serving as a variable resistive element with the source of the selection transistor 3 constituted by an N-type MOS transistor, and by connecting the drain of the selection transistor 3 with a bit line BL, the other end of the RRAM device 2 with a source line SL, and the gate of the selection transistor 3 with a word line WL. The memory cell has a configuration similar to the conventional memory cell configurations shown in FIG. 5 and FIG. 6 in that the variable resistive element 2 and selection transistor 3 are connected in series. In the case of these conventional configurations, however, one end of an MJT device or RRAM device serving as the variable resistive element 2 is connected to the bit line BL side and the source of the selection transistor 3 is connected to the source line SL side. In the case of this embodiment, however, one end of the RRAM device 2 is connected to the sour line SL side and the drain side of the selection transistor 3 is connected to the bit line BL side as shown in FIG. 1.

In this case, the RRAM device 2 is a nonvolatile memory device capable of storing data in accordance with a change of electrical resistances because electrical resistances are changed when an electrical stress is applied and the changed electrical resistance is held even after the electrical stress is released. For example, the nonvolatile memory device is fabricated by forming a film by a material shown as $Pr_{(1-x)}Ca_xMnO_3$, $La_{(1-x)}Ca_xMnO_3$, or $La_{(1-x-y)}Ca_xPb_yMnO_3$ (in this case, x<1, y<1, and x+y<1), for example, a manganese oxide film of $Pr_{0.7}Ca_{0.3}MnO_3$, $La_{0.65}Ca_{0.35}MnO_3$, or $La_{0.65}Ca_{0.175}Pb_{0.175}MnO_3$ in accordance with the MOCVD method, spin coating method, laser ablation method, or sputtering method.

Figure 2:
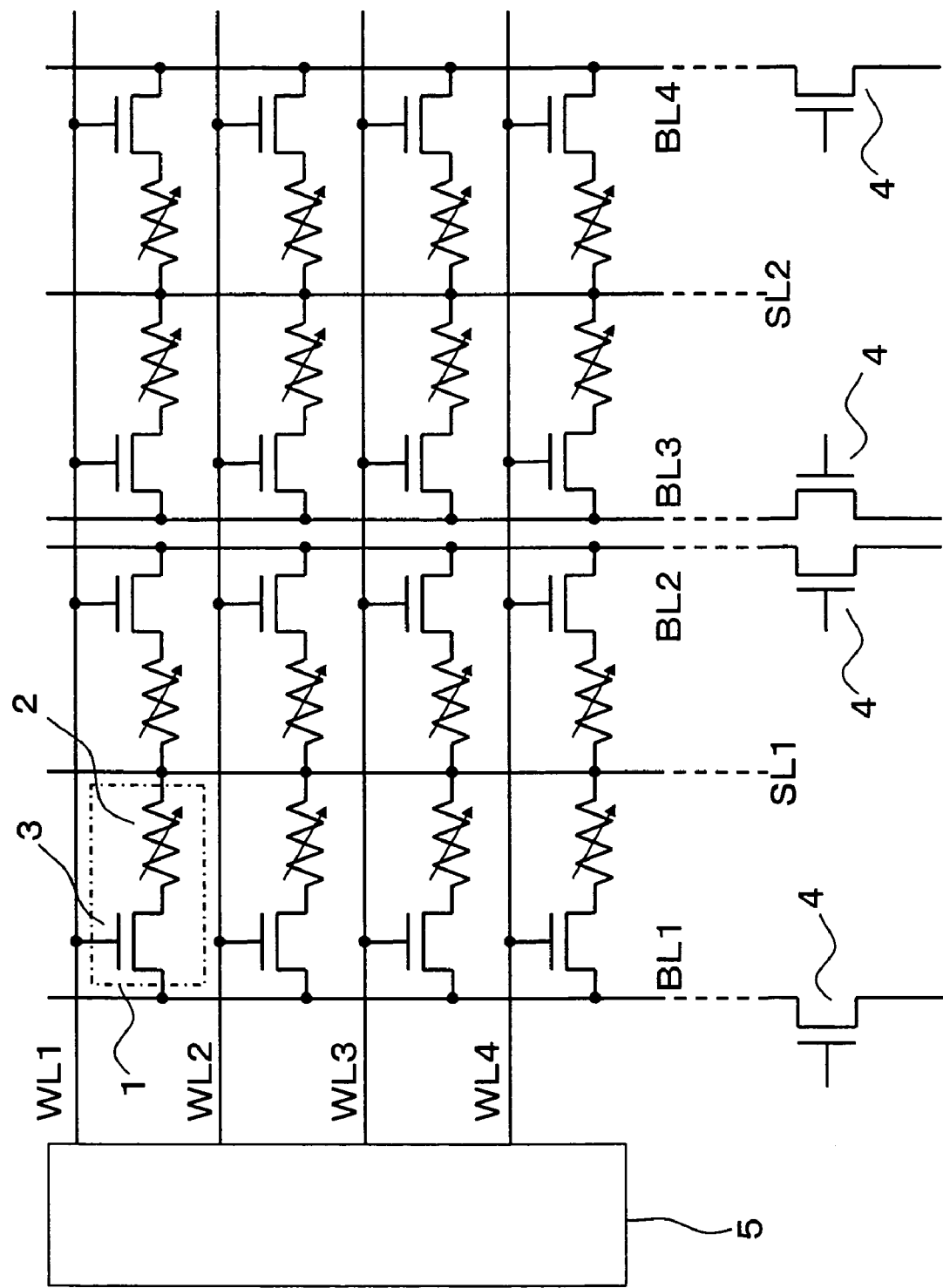
FIG. 2 is a circuit diagram showing a memory cell array of the embodiment of the nonvolatile semiconductor memory device of the present invention.

FIG. 2 shows a memory array configuration of the present invention device to which the memory cell in FIG. 1 is applied. The reading operation of the memory array in FIG. 2 is described below. When reading a selected memory cell, the bit line selection transistor 4 connected to the selected memory cell is turned on and a predetermined bias voltage (e.g. 1.5 V) is applied to a selected bit line and at the same time, a word line connected to the gate of the selection transistor (cell selection transistor) 3 connected the RRAM device 2 of the selected memory cell is set to a high level (e.g. 7 V) by a word line driver 5 to turn on the cell selection transistor 3. Moreover, by setting a source (connected to common source lines SL1 and SL2) connected to the selected memory cell to the reference voltage such as ground potential 0 V, a current route to the ground potential from the bias voltage of a bit line BL via the cell selection transistor 3 and RRAM device 2 is generated.

For an unselected memory cell, however, by setting a word line WL connected to an unselected memory cell to a predetermined potential (e.g. 0 V) by the word line driver 5, the RRAM device 2 of the unselected memory cell and a selected bit line BL are electrically isolated.

Under the above state, only a change of resistances of the RRAM device 2 of the selected memory cell 1 appears as a change of currents flowing through a bit line BL and it is possible to accurately read information from the selected memory cell by determining the current change by a reading circuit. Moreover, because the RRAM device 2 of the unselected memory cell and the selected bit line BL are electrically isolated, even if applying the reading operation repeatedly to the same bit line BL, a voltage stress is not directly applied to the RRAM device 2 of the unselected memory cell from the bit line BL. As a result, a change of resistance states of the RRAM device 2 due to the voltage stress, that is, the possibility of erasure of stored data resistance is greatly reduced.

Figure 3:
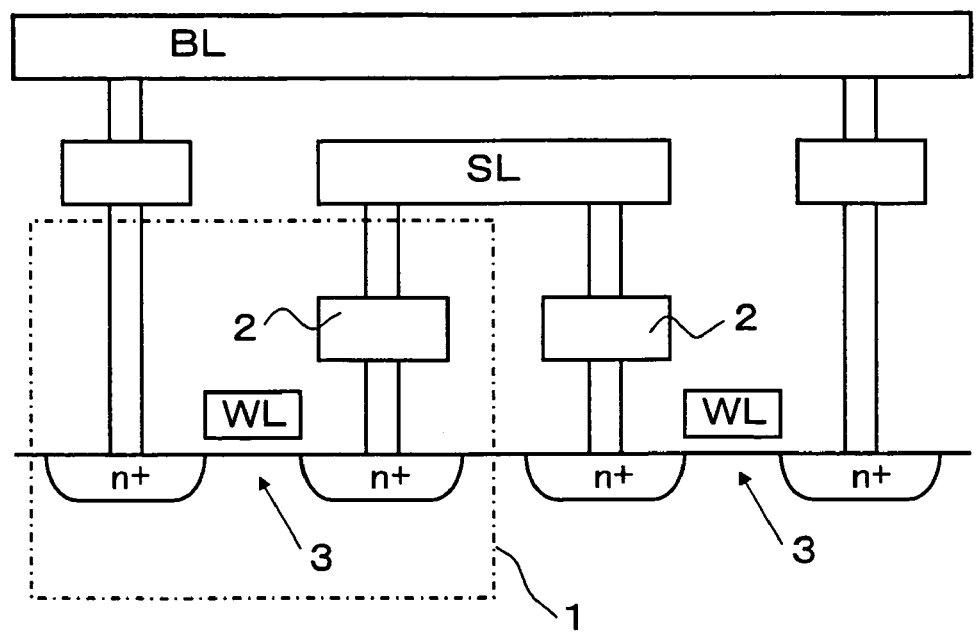
FIG. 3 is a sectional view schematically showing a sectional structure of the memory cell shown in FIG. 1.

Though the reading operation is described above, the same advantage is expected also at the time of the programming operation. That is, when repeatedly applying the programming operation to the RRAM device 2 of the memory cell 1, the stored resistance states are unnecessarily changed because a programming bias voltage is not applied from a bit line BL to the RRAM device 2 of other unselected memory cell 1 connected to the bit line BL connected to the programming RRAM device 2. Thereby, the reliability of the RRAM device 2 for holding data is further improved. FIG. 3 shows a schematic sectional view of the memory cell 1 in FIG. 1.

Moreover, though the memory array configuration shown in FIG. 2 is a configuration of 4×4 for convenience' sake of explanation, the number of memory cells to be arranged is not restricted to the above 4×4.

Then, a second embodiment of the present invention is described below.

Figure 4:
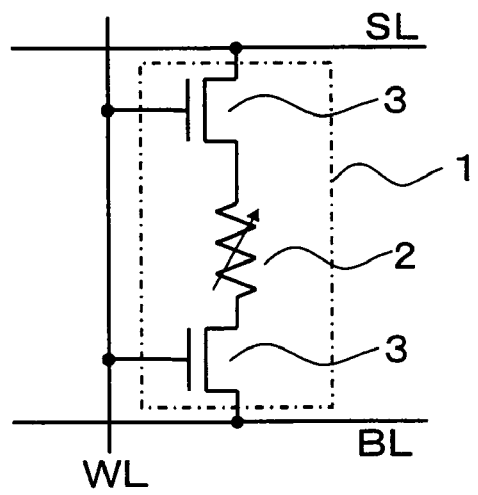
FIG. 4 is a circuit diagram showing a memory cell of another embodiment of the nonvolatile semiconductor memory device of the present invention.

FIG. 4 shows a second memory cell configuration of the present invention device in which first and second selection transistors 3 are connected in series at both sides of an RRAM device 2. In the case of the memory cell configuration of the first embodiment (FIGS. 1 and 2), a disturb phenomenon (unintentional rewriting of stored data) of an unselected memory cell caused by repeatedly applying a voltage stress to the RRAM device 2 of the unselected memory cell is canceled and the data retention characteristic can be improved at the time of the reading operation and programming operation.

In the case of the erasing operation, however, when collectively erasing the plurality of memory cells connected to a common source line SL every block by assuming the memory cells as one block, even the configuration of the first embodiment does not matter. However, in the case of erasing every memory cell, a disturb phenomenon may occur in the RRAM device 2 of an unselected memory cell. For example, when individually erasing a certain selected memory cell every memory cell, a disturb phenomenon may also occur in an unselected memory cell in the same block at the time of the erasing operation because a voltage of 3 V is applied to a source line by applying 0 V to a bit line in a selected column and, for example, 7 V to a word line in an unselected row and, for example 3 V to a source line connected to a selected memory cell. In the case of the memory cell structure of the second embodiment shown in FIG. 4, the selection transistor 3 is set to the both ends of the variable resistive element 2. Therefore, it is possible to prevent a disturb phenomenon at the time of the individual erasing operation every memory cell, prevent a voltage stress from being applied to the RRAM device 2 even in the case of any one of the reading operation, programming operation, and erasing operation and the data retention characteristic can be further improved.

In the case of each of the above embodiments, voltages to be applied to a bit line, word line, and source line in the reading operation, programming operation, and erasing operation should be decided depending on the characteristic of a RRAM device used. Because the above voltage values are examples, they are not restricted to the voltage values of the above embodiments.

According to the first embodiment of the present invention, because a memory cell is constituted by connecting a variable resistive element with a selection transistor in series, the selection transistor is turned off for a memory cell in an unselected row. Therefore, it is possible to cut off a current route passing through variable resistive elements other than that of a selected memory cell and therefore, a problem does not occur that a selected memory cell cannot correctly be read at the time of the reading or programming operation and that the data is erroneously programmed in an unselected memory cell. Moreover, because a configuration is used in which a selection transistor is set between a bit line and a variable resistive element, a voltage stress is not applied to the variable resistive element of an unselected memory cell from the bit line even if repeating reading or programming of data from or in the same bit line. As a result, rewriting of stored data due to a change of resistance states is not executed by a voltage stress and the reliability of a variable resistive element for data retention is improved. Moreover, according to the second embodiment of the present invention device, it is possible to prevent a disturb phenomenon also at the time of erasing in the individual erasing operation every memory cell and prevent data from being written because a voltage stress is applied to a RRAM device of an unselected memory cell even in the case of any one of the reading operation, programming operation, and erasing operation.

Although the present invention has been described in terms of a preferred embodiment, it will be appreciated that various modifications and alterations might by made by those skilled in the art without departing from the spirit and scope of the invention. The invention should therefore be measured in terms of the claims which follow.

What is claimed is:

1. A nonvolatile semiconductor memory device comprising:
   a memory cell array constituted by arranging a plurality of nonvolatile memory cells in a row direction and a column direction respectively and arranging the plurality of word lines and the plurality of bit lines in the row direction and the column direction respectively in order to select a predetermined memory cell or a memory cell group out of the arranged nonvolatile memory cells; wherein;
   the memory cells are respectively constituted by connecting one end of a variable resistive element for storing information in accordance with a change of electrical resistances with the source of a selection transistor,
   in the memory cell array, the drain of the selection transistor is connected with a common bit line along the column direction, the other end of the variable resistive element is connected with a source line, and the gate of the selection transistor is connected with a common word line along the row direction, and
   the variable resistive element is a variable resistive element whose electrical resistance is changed due to an electrical stress.

2. The nonvolatile semiconductor memory device according to claim 1, wherein the variable resistive element is formed by a perovskite structural oxide containing manganese.

3. A nonvolatile semiconductor memory device comprising:
   a memory cell array constituted by arranging the plurality of nonvolatile memory cells in a row direction and a column direction respectively and arranging the plurality of word lines and the plurality of bit lines in the row direction and the column direction respectively in order to select a predetermined memory cell or a memory cell group out of the arranged nonvolatile memory cells; wherein
   the memory cells are respectively constituted by connecting one end of a variable resistive element for storing information in accordance with a change of electrical resistances with the source of a first selection transistor and moreover connecting the other end of the variable resistive element with the drain of a second selection transistor, and
   in the memory cell array, the drain of the first selection transistor is connected with a common bit line along the column direction, the source of the second selection transistor is connected with a source line, and gates of the first and second selection transistors are connected with a common word line along the row direction.

4. The nonvolatile semiconductor memory device according to claim 3, wherein the variable resistive element is a variable resistive element whose electrical resistances are changed due to an electrical stress.

5. The nonvolatile semiconductor memory device according to claim 4, wherein the variable resistive element is formed by a perovskite-structural oxide containing manganese.

* * * * *